United States Patent
Palara

(10) Patent No.: US 6,599,812 B1
(45) Date of Patent: Jul. 29, 2003

(54) MANUFACTURING METHOD FOR A THICK OXIDE LAYER

(75) Inventor: Sergio Palara, Aci S. Antonio (IT)

(73) Assignee: STMicroelectronics S.r.l., Agrate Brianza (IT)

(*) Notice: Subject to any disclaimer, the term of this patent is extended or adjusted under 35 U.S.C. 154(b) by 0 days.

(21) Appl. No.: 09/425,443

(22) Filed: Oct. 22, 1999

(30) Foreign Application Priority Data

Oct. 23, 1998 (EP) .............................. 98830637

(51) Int. Cl.[7] ................................................ H01L 21/76
(52) U.S. Cl. ......................................... 438/424; 438/425
(58) Field of Search .......................... 438/437, 435, 438/424, 400, 428, 444, 425, FOR 232

(56) References Cited

U.S. PATENT DOCUMENTS

| | | | | |
|---|---|---|---|---|
| 4,735,901 A | * | 4/1988 | Kurtz et al. | 435/255.2 |
| 4,791,073 A | * | 12/1988 | Nagy et al. | 437/67 |
| 5,189,501 A | * | 2/1993 | Kawamura et al. | 257/647 |
| 5,374,583 A | | 12/1994 | Lur et al. | 437/67 |
| 5,492,858 A | * | 2/1996 | Bose et al. | 437/67 |
| 5,747,377 A | | 5/1998 | Wu | 438/444 |
| 5,756,389 A | * | 5/1998 | Lim et al. | 438/425 |
| 5,804,491 A | * | 9/1998 | Ahn | 438/424 |
| 5,897,361 A | * | 4/1999 | Egawa et al. | 438/435 |
| 6,057,211 A | * | 5/2000 | Schwalke | 438/428 |
| 6,057,241 A | * | 5/2000 | Matsuda et al. | 438/689 |

FOREIGN PATENT DOCUMENTS

| | | | | |
|---|---|---|---|---|
| EP | 0214512 | * | 3/1987 | ........... H01L/21/76 |
| JP | 56094646 | | 7/1981 | |
| JP | 59112633 A | * | 6/1984 | |
| JP | 05190663 | | 7/1993 | |

OTHER PUBLICATIONS

Wolf S. "Silicon Processing for the VLSI-ERA: vol. 2-Process Integration", 1990, Lattice Pr., vol. 2, pp. 51-58.*

* cited by examiner

Primary Examiner—George Fourson
Assistant Examiner—Suk-San Foong
(74) Attorney, Agent, or Firm—Lisa K. Jorgenson; Robert Iannucci; Seed IP Law Group PLLC

(57) ABSTRACT

A method for manufacturing a thick oxide layer on a semiconductive substrate is presented. The method comprises the formation of at least one layer of dielectric material on said substrate, followed by formation of a plurality of trench regions of a predetermined width in the substrate. A plurality of corresponding walls of semiconductive material of a second predetermined width are delimited. Finally, the semiconductor is submitted to a thermal treatment to oxidize said walls.

12 Claims, 5 Drawing Sheets

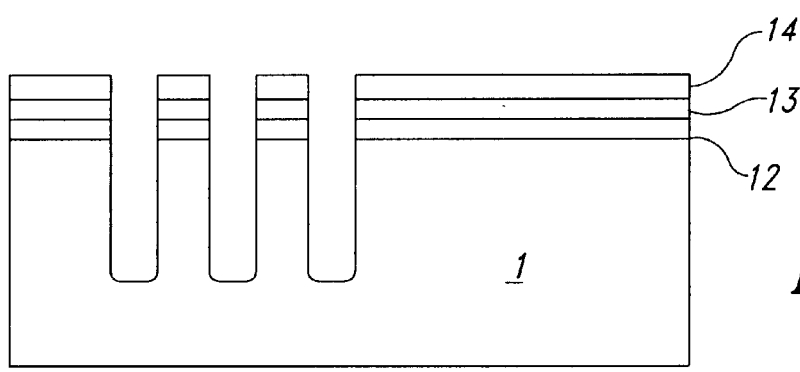
*FIG. 9*
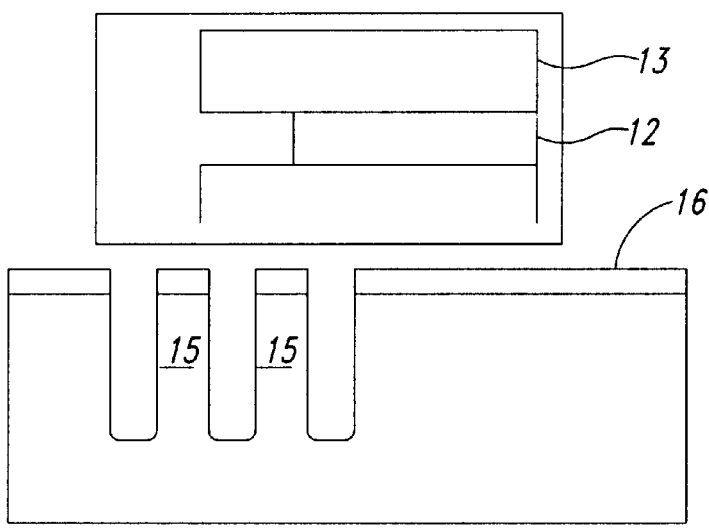
*FIG. 10*
*FIG. 11*
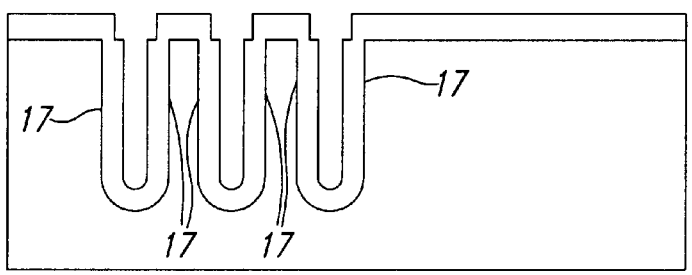
*FIG. 12*
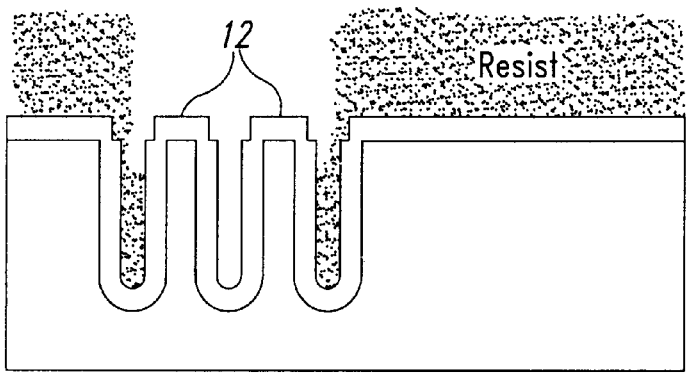
*FIG. 13*

MANUFACTURING METHOD FOR A THICK OXIDE LAYER

TECHNICAL FIELD

The present invention relates to a method for manufacturing a thick oxide layer on a semiconductor substrate using a trenching method.

BACKGROUND OF THE INVENTION

As is well known, a process for manufacturing a layer of thick oxide on a portion of semiconductive substrate of a wafer comprises the following steps: the formation of a thin layer of oxide; the formation of a layer of nitride, for protecting the portion of semiconductive substrate where the thick layer of oxide will not be formed; and the carrying out of a thermal treatment in wet oxidizing atmosphere ($O_2$ wet).

According to the prior art, in order to obtain a layer of oxide, for example, of 3 $\mu$m it is necessary to carry out a thermal treatment in a wet oxidizing atmosphere of the wafer for about 15 hours at a temperature of 1100° C. This is an example of a LOCOS (local oxidation of silicon) oxide process. Some of the problems with the LOCOS process are: formation of a "bird beak" structure, a lack of planarization of the structure, the requirement of a very high temperature, and a long oxidation time. Because of these problems, oxide layers are generally not grown more than 2–3 $\mu$m thick.

FIG. 1 shows a portion of semiconductive substrate 1' of wafer on which a thick layer of oxide 4' has been formed according to the prior art. As is evident from the drawing, after having carried out the thermal treatment, the layer of oxide 4' is also formed between the layer of nitride 3' and the substrate 1' connecting with the thin layer of oxide 2'. In particular, the layer of oxide 4' extends itself under the layer of nitride 3' by an amount which is substantially about its thickness D'. This is the bird beak structure.

Furthermore, the surface of this layer of oxide 4' is raised, with respect to the surface of the substrate 1, of an amount equal to half the thickness D' of the layer itself.

Therefore, after the formation of the layer of oxide 4', the entire surface of the wafer is not planar.

A known technical solution for planarizing the surface of the wafer is described in the book: "SILICON PROCESSING FOR THE VLSI ERA," VOL. II, page 42, hereby incorporated by reference.

Thermal treatment with high temperatures is also necessary in order to carry out this process of planarization.

SUMMARY OF THE INVENTION

Embodiments of the present invention are directed toward a method for manufacturing a thick layer of oxide, having such characteristics which allow the formation and subsequent planarization with a low thermal temperature that overcomes the limitations and/or the drawbacks which, at the moment limit the methods for forming thick layers of oxide according to the prior art.

Embodiments of the invention form, in the portion of substrate where the formation of a layer of thick oxide is desired, a plurality of trenches, before carrying out conventional thermal treatments.

Characteristics and advantages of the invention will be seen from the description, following herein, of an embodiment given as an indication and not limiting with reference to the drawings attached.

BRIEF DESCRIPTION OF THE DRAWINGS

FIGS. 9–21 show cross sectional views of a portion of semiconductive substrate on which process steps for manufacturing a layer of thick oxide according to a third embodiment of the present invention are shown.

DETAILED DESCRIPTION

Figure 1:
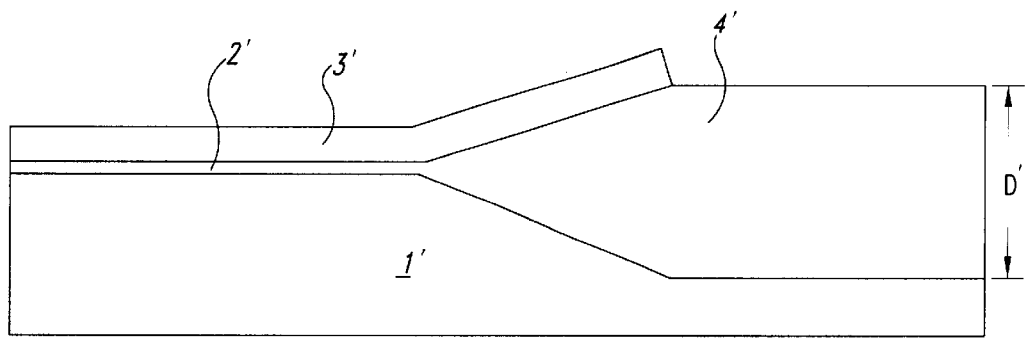
FIG. 1 shows a cross section of a portion of a semiconductive substrate on which a thick layer of oxide is formed according to the prior art.
Figure 2:
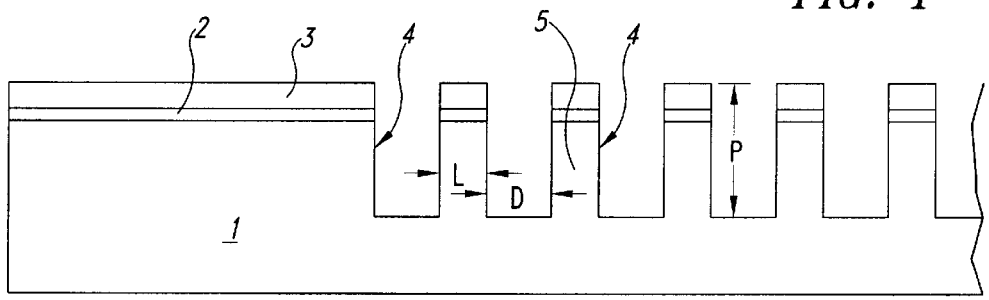
FIGS. 2–6 show cross-sectional views of a portion of a semiconductive substrate on which process steps for manufacturing a layer of thick oxide according to a first embodiment of the present invention are shown.

With reference to FIG. 2, a method according to an embodiment of the invention will now be described for manufacturing a layer of thick oxide 6 onto a semiconductive substrate 1.

The process and the structures described hereinbelow do not form a complete process flow for manufacturing integrated circuits. The present invention can be put into practice together with the techniques for manufacturing integrated circuits presently used in the field, and only the process steps commonly used are included which are necessary for the understanding of the present invention. Discussion of processes well know to those skilled in the art has been abbreviated or eliminated for brevity.

The figures which represent cross sections of portions of an integrated circuit during formation are not drawn to scale, but are instead drawn in order to show the important features according to the invention.

On the surface of substrate 1, a layer of thin oxide 2 is formed, for example having a thickness of a few hundred Angstroms. Above this oxide layer 2, a layer of insulating material 3 can be deposited, in particular silicon nitride, for example of the thickness of around a thousand Angstroms.

By means of known photolithographic techniques and subsequent etches of the portion of substrate 1 where the formation of the thick oxide is desired, a plurality of trench regions 4 are formed in the substrate. Advantageously, these trench regions 4 are parallel to each other.

The trench regions 4 delimit a plurality of walls 5 of semiconductive material. Advantageously these walls 5 extend themselves parallel to the regions of trench 4 and show substantially a comb profile if looked at along a vertical section which crosses at least two walls 5 as shown in FIG. 2.

Advantageously, the depth P of the trench regions 4 can be a little smaller than the thickness S of the layer of oxide which needs to be formed.

The nitride layer 3 can, if necessary, be removed from the structure of FIG. 2 and therefore the semiconductor is subjected to a thermal treatment in oxidizing atmosphere. As is known, during thermal treatment a portion of semiconductive substrate transforms itself into a layer of oxide.

Figure 3:
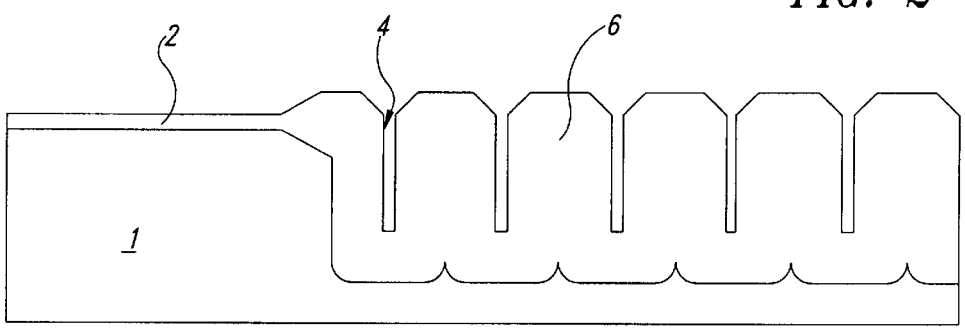
Figure 4:
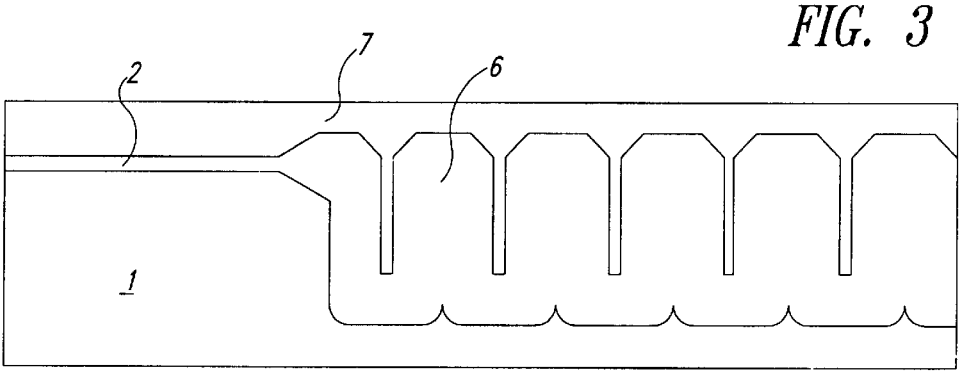

As shown in FIG. 3, after having carried out the oxidizing thermal treatment, the walls 5 of semiconductive material are transformed into walls 6 formed by a layer of oxide.

In a first embodiment, the trench regions 4 are so dimensioned that, at the end of oxidation and after the formation of the oxide walls 6 of oxide, the trench regions 4 are not completely filled, but are only narrowed, decreasing their width between them, for example, from 5000 to 1000–3000 Angstroms.

Figure 5:
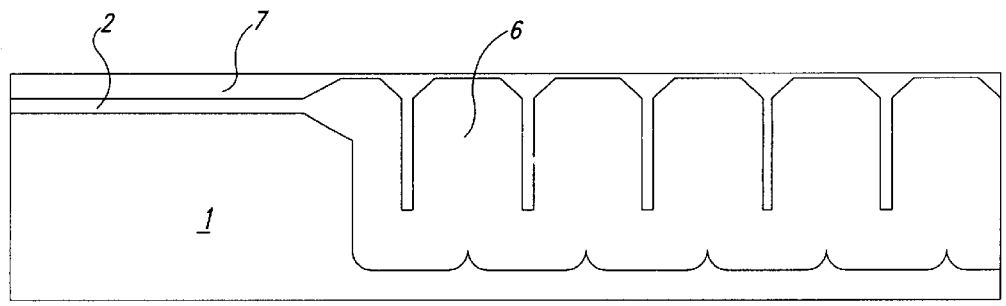
Figure 6:
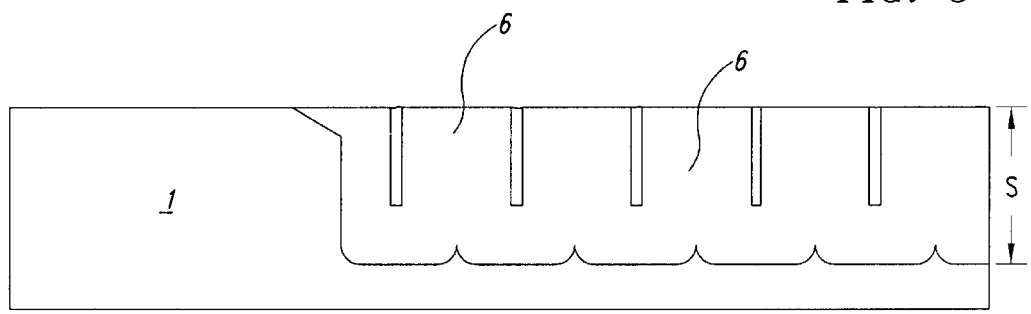

At this point a planarizing layer 7 of insulating material is laid which fills the trench regions as shown in FIG. 5. A so-called anisotropic etch-back planarizing etch is thereafter carried out as shown in FIG. 6, to which a planarization process can follow, for example of the chemical-mechanical type.

Figure 7:
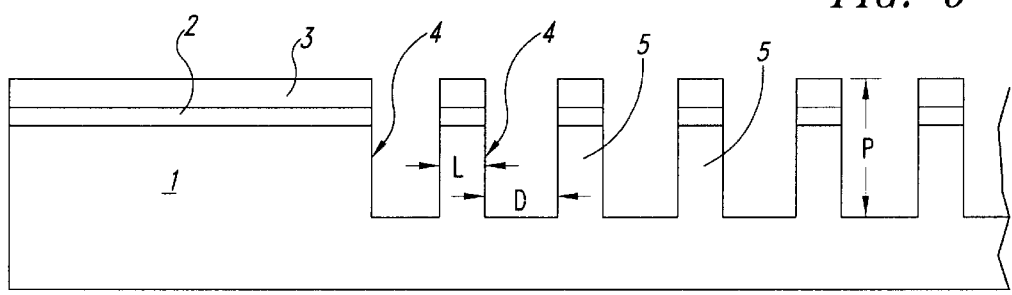
FIGS. 7–8 show cross sectional views of a portion of semiconductive substrate on which process steps for manufacturing a layer of thick oxide according to a second embodiment of the present invention are shown.
Figure 8:
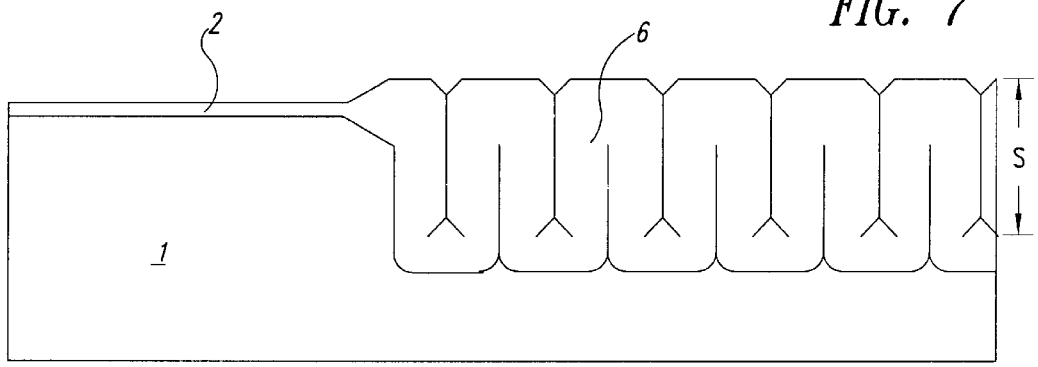

In a second embodiment, illustrated in FIGS. 7 and 8, the width L of each single wall 5 between two adjacent trenches 4 is about 0.45 $\mu$m and the distance D between the walls of one trench is about 0.55 $\mu$m, so that the distance between a vertical wall of a trench and the corresponding vertical wall of the adjacent trench, the so-called pitch, is about 1 $\mu$m.

As is known, a layer of silicon of 0.45 $\mu$m thickness, in oxidizing atmosphere at a temperature of 1100° C. and for around an hour, forms a layer of oxide of 1 $\mu$m.

Therefore, when a 0.45 $\mu$m wide wall 5 is oxidized, an oxide wall 6 is formed of width L' equal to 1 $\mu$m, that is 0.5 $\mu$m to the right and 0.5 $\mu$m to the left from a longitudinal axis of the center of the wall 5 of semiconductive material before the thermal treatment.

As can be seen in FIG. 8, in this embodiment trenches 4 are completely filled by the layer of oxide. The layer of oxide grows by 0.5 $\mu$m from the bottom of the trench and in a smaller amount on the surface of the wall between one trench and another. Overall the resulting layer of oxide is greater than the depth of the trench.

Advantageously, by forming trenches 5 $\mu$m deep, an overall oxide thickness of about 5.7 $\mu$m is obtained. In the same time this embodiment of the invention grew an oxide layer having a 5.7 $\mu$m thickness, the prior art would have only produced an oxide thickness of about 0.5 $\mu$m.

Furthermore by forming a layer of oxide according to this embodiment, there is a smaller final difference in level with respect to the prior art between the surface of the substrate 1 and the layer of oxide 6 formed.

In a third embodiment, depicted in FIGS. 9–18, an oxide layer 12 is grown on the silicon substrate to a thickness of a few hundred Angstroms, for example 200–400. Then, for example, using an LPCVD (Low-Pressure Chemical Vapor Deposition) technique, a thin layer of silicon nitride 13 is deposited on the oxide layer 12. The silicon nitride layer 13 is several hundred Angstroms thick, for example 400–700. Next, another oxide layer 14, around 1000 Angstroms thick is deposited over the nitride layer.

Through well known photolithographic techniques, trenches shown in FIG. 9 are created. In one variation of this embodiment, the depth of the trench is higher than the thickness of the dielectric desired to be formed.

In this embodiment, both the width of the trench and the distance between adjacent trenches is 1 $\mu$m. This corresponds to a pitch (island+opening) of 12 $\mu$m. Other dimensions are also possible.

The deposited oxide 14 is then etched away, and at the same time, a portion of the lateral sides of the oxide layer 12 (pad oxide) will also be partially etched. These lateral sides of the pad oxide 12 were exposed by the photolithographic technique used to form the trenches. A close up view of the etching of the pad oxide 12 under the nitride layer 13 near the openings of the trench is shown in FIG. 10.

The width of these portions of the pad oxide 12 is determined by the duration of the etching process used to etch oxide layer 14, as well as the composition of the etching solution and the temperature of the etch. In one version of this embodiment, the width of these portions is about 0.2–0.3 $\mu$m, as shown in FIG. 10.

Then, a pyrolithic nitride layer 16 is deposited, for instance in an oven, to a thickness of about one-half of the thickness of the pad oxide 12. For instance, if the pad oxide 12 has a thickness of 250 angstroms, the nitride layer 16 would be at least 150 angstroms thick. The nitride layer 16 is deposited such that it fills the areas of underetch of the pad oxide 12 seen in FIG. 10. The pyrolithic nitride 16 is deposited and etched to give it the appearance as it is shown in FIG. 11.

Next, a thermal treatment is used to grow a lateral oxide 17 on the lateral portions of the silicon walls 15. As described above, the oxide consumes some of the silicon as it grows. The silicon walls 15 after the lateral oxide 17 growth will be reduced about the same thickness as the oxide grown on the walls of silicon, and of the trench walls. As a result, at the end of the oxidation, the structure will look as shown in FIG. 12. For example, if a lateral oxide 17 of 0.5 $\mu$m is grown, the thickness of the silicon walls 15 will be reduced of about 0.5 $\mu$m while the width of the trench is reduced also by 0.5 $\mu$m. Of course, during this lest step of oxidation, the active areas of the device will not oxidize because they are protected by the nitride layer 13.

Then, using standard a photolithographic techniques, a photoresist layer is formed on the substrate 1 except at the area where the thick oxide will be formed. That is the area where the trench has been formed. The photoresist layer may partially fill one or more trenches. After the photoresist layer has been deposited, the nitride layer 13 and the pad oxides 12 are etched away. After this last step, the structure is as shown in FIG. 14.

Figure 14:
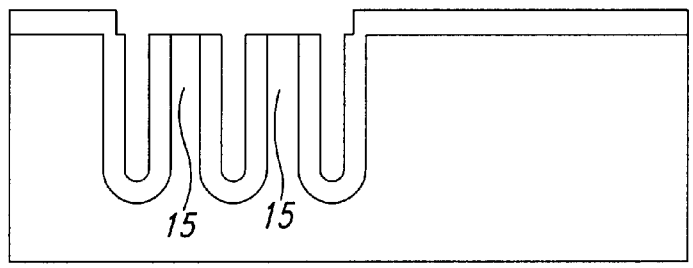
Figure 15:
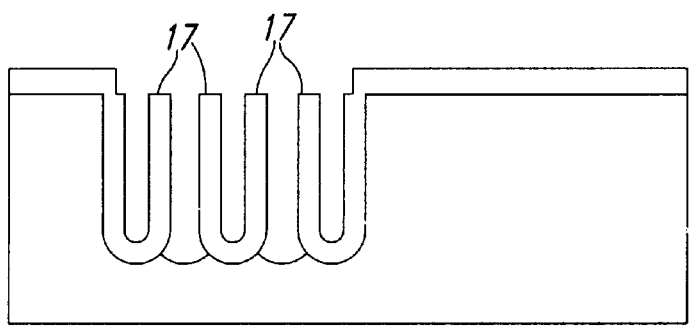

The next chemical etch, will etch away in a selective way the silicon walls 15 that were not oxidized between two adjacent trenches, as seen in FIG. 14. This etch will be calibrated in a way to dig the silicon walls 15 to the same level (depth) of the trench formed before with the anisotropic plasma etch. At the end of this silicon etch, oxide walls 17 in a U form shape and anchored to the silicon substrate remain, as shown in FIG. 15.

Figure 16:
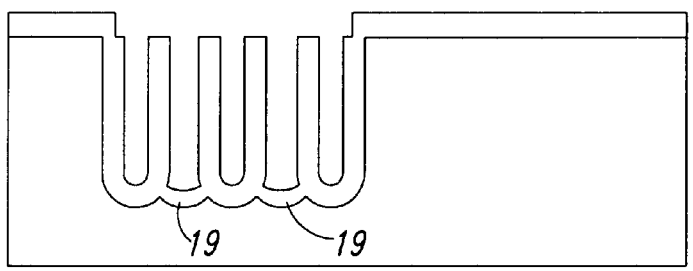

The structure as formed will be subjected to a thermal oxidation so to grow an oxide 19 on the silicon surface that wasn't covered by the nitride layers 3 and 5. Afterward this step, the oxide thickness in all these areas in which the oxide is in contact with the silicon is increased, as shown in FIG. 16.

Figure 17:
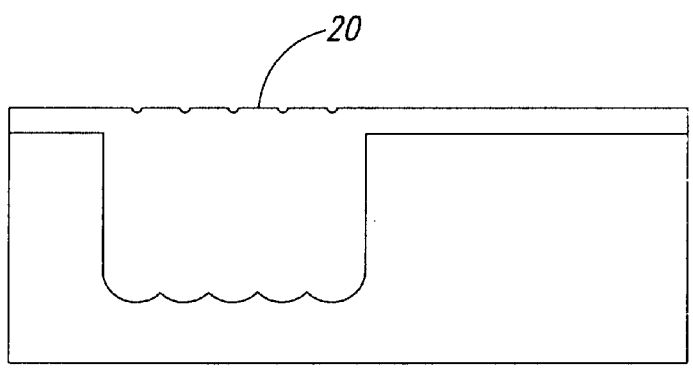
Figure 18:
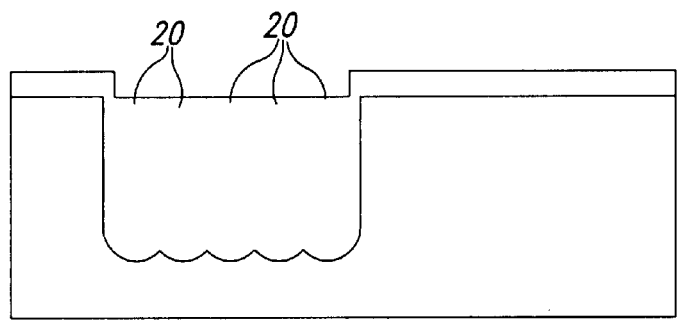

A successive deposition with an elevated conforming oxide of dielectric 20 succeeds in filling the trench as shown in FIG. 17. The planarization of the structure can be obtained by a CMP (Chemical Mechanical Polishing) technique or with an etchback of the dielectric. The planaraized structure is shown in FIG. 18.

Figure 19:
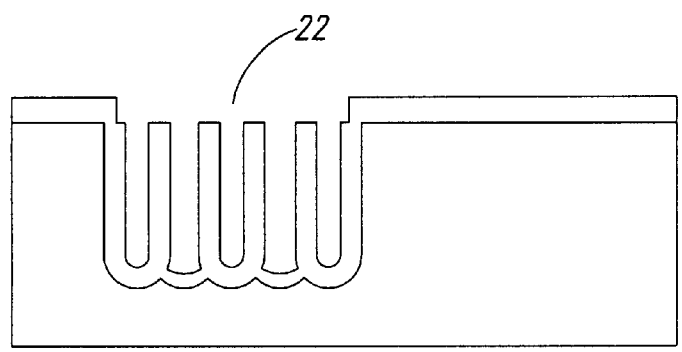
Figure 20:
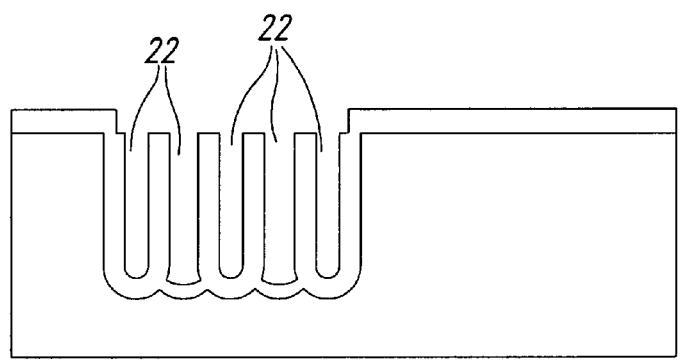

As additional examples, the dielectric material can be a TEOS or a polysilicon 22. If a polysilicon 22 is used, as shown in FIG. 19, the planarization of the structure can be formed with an etch back of the polysilicon 22 or with a plasma etch that stops on the nitride layers, as shown in FIG. 20.

Figure 21:
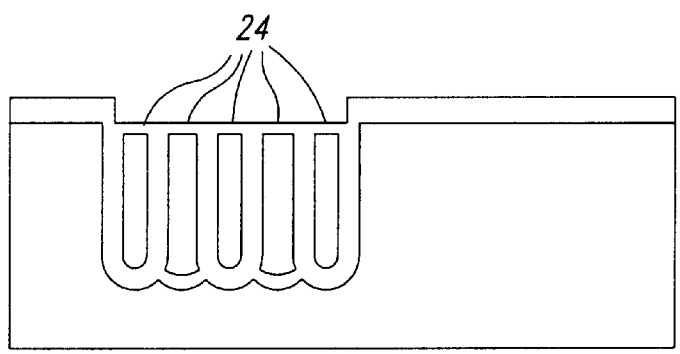

Finally, a thermal oxidation forms of a cap oxide 24 as shown in FIG. 21, completing the structure. Of course, during the oxidation of the cap oxide 24, the active areas of the substrate will be protected by the nitride layers.

This third embodiment has the advantage of relaxed tolerances in forming the silicon walls 15. In the second embodiment above, having equidistant trenches formed a better oxide. This situation is difficult to form because the photolithographic techniques used form these geometries can vary by +/−10%, making it hard to form equidistant trenches. In the third embodiment, the tolerances need not be so strict to ensure a proper thick oxide production.

Changes can be made to the invention in light of the above detailed description. In general, in the following claims, the terms used should not be construed to limit the invention to the specific embodiments disclosed in the specification and the claims, but should be construed to include all methods and devices that are in accordance with the claims. Accordingly, the invention is not limited by the disclosure, but instead its scope is to be determined by the following claims.

What is claimed is:

1. A method for manufacturing a thick oxide layer on a semiconductor substrate, the method comprising:

forming a plurality of trench and wall regions in the semiconductor substrate;

thermally oxidizing a portion of each wall region;

removing the non-oxidized portions of each wall region;

thermally oxidizing the areas of the semiconductor substrate where the non-oxidized portions of each wall region were removed; and filling the remaining trench regions with a dielectric material, wherein the step of forming a plurality of trench and wall regions in the semiconductor substrate forms first trench regions, the step of removing the non-oxidized portions of each wall region forms second trench regions, and the step of filling the remaining trench regions includes simultaneously filling the first and second trench regions.

2. The method for manufacturing a thick oxide layer according to claim 1 further comprising planarizing the semiconductor substrate after filling the remaining trench regions.

3. The method for manufacturing a thick oxide layer according to claim 1, wherein the dielectric material includes polysilicon, and further comprising plasma etching the semiconductor substrate.

4. The method for manufacturing a thick oxide layer according to claim 2, further comprising forming a cap oxide over planarized thick oxide layer.

5. A method for manufacturing a thick oxide layer on a semiconductor substrate, the method comprising:

forming a first plurality of trenches in the substrate and leaving wall regions of the substrate between the trenches;

thermally oxidizing a portion of each wall region, thereby leaving a non-oxidized portion of each wall region;

removing the non-oxidized portion of each wall region, thereby leaving a second plurality of trenches between the oxidized portions of the wall regions;

thermally oxidizing a bottom substrate wall of each of the second plurality of trenches; and filling the first and second pluralities of trenches with a dielectric material, wherein the step of filling the first and second pluralities of trenches with a dielectric material includes filling the first plurality of trenches simultaneously with filling the second plurality of trenches.

6. The method of claim 5, further comprising planarizing the substrate after filling the trenches.

7. The method of claim 5 wherein the dielectric material is a polysilicon material, and further comprising plasma etching the polysilicon material to planarize the substrate and thick oxide layer.

8. The method of claim 7, further comprising forming a cap oxide over the planarized thick oxide layer.

9. The method of claim 5, wherein the step of thermally oxidizing a bottom substrate wall of each of the second plurality of trenches is performed prior to filling the trenches with dielectric material.

10. The method of claim 1 wherein the step of simultaneously filling the first and second trench regions is performed after the step of thermally oxidizing the areas of the semiconductor substrate where the non-oxidized portions of each wall region were removed.

11. The method of claim 1 wherein thermally oxidizing the areas of the semiconductor substrate where the non-oxidized portions of each wall region were removed produces thermally grown oxide walls, and the step of filling the remaining trench regions with a dielectric material is performed while the thermally grown oxide walls remain in place.

12. The method of claim 5 wherein the step of filling the first and second pluralities of trenches with a dielectric material is performed while the bottom substrate wall remains thermally oxidized.

* * * * *

UNITED STATES PATENT AND TRADEMARK OFFICE
CERTIFICATE OF CORRECTION

PATENT NO. : 6,599,812 B1  Page 1 of 1
DATED : July 29, 2003
INVENTOR(S) : Sergio Palara et al.

It is certified that error appears in the above-identified patent and that said Letters Patent is hereby corrected as shown below:

<u>Title page,</u>
Item [12], "Palara" should read as -- Palara et al. --.
Item [75], the Inventor data should read as -- Sergio Palara, Aci S. Antonio (IT); Cirino Rapisarda, Belpasso (IT); Giuseppe Arena, Catania (IT) --.

Signed and Sealed this

Second Day of December, 2003

JAMES E. ROGAN
*Director of the United States Patent and Trademark Office*